United States Patent
Lin et al.

(10) Patent No.: US 8,476,164 B1
(45) Date of Patent: Jul. 2, 2013

(54) METHOD OF MANUFACTURING SEMICONDUCTOR DEVICE WITH SILICIDE

(71) Applicant: United Microelectronics Corp., Hsinchu (TW)

(72) Inventors: Chin-Fu Lin, Tainan (TW); Chin-Cheng Chien, Tainan (TW); Chih-Chien Liu, Taipei (TW); Chia-Lin Hsu, Tainan (TW); Chun-Yuan Wu, Yunlin County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/661,111

(22) Filed: Oct. 26, 2012

(51) Int. Cl.
*H01L 21/44* (2006.01)

(52) U.S. Cl.
USPC .......................................... 438/683; 438/682

(58) Field of Classification Search
USPC ......................................... 438/592, 682, 683
See application file for complete search history.

(56) References Cited

U.S. PATENT DOCUMENTS

| | | | |
|---|---|---|---|
| 5,998,873 | A | 12/1999 | Blair et al. |
| 6,333,262 | B1 | 12/2001 | Tseng et al. |
| 7,214,620 | B2 | 5/2007 | Kim et al. |
| 7,700,448 | B2 | 4/2010 | Futase et al. |
| 2006/0148153 | A1* | 7/2006 | Kwon et al. ................ 438/197 |
| 2010/0040768 | A1 | 2/2010 | Dhindsa |

* cited by examiner

*Primary Examiner* — Bradley K Smith
(74) *Attorney, Agent, or Firm* — WPAT, PC; Justin King

(57) ABSTRACT

A method of manufacturing semiconductor device is provided. A substrate at least with a patterned silicon-containing layer on the substrate and spacers adjacent to the patterned silicon-containing layer is provided. A metal layer is formed on the substrate and covers the patterned silicon-containing layer and spacers. Then, a capping layer is formed on the metal layer. A first rapid thermal process is performed to at least make a portion of the metal layer react with the substrate around the spacers to form transitional silicides. The capping layer and the unreacted portions of the metal layer are removed. A first nitride film with a first tensile stress S1 is formed on the substrate. A second rapid thermal process is performed to transfer the transitional silicide to a silicide and transfer the first nitride film to a second nitride film with a second tensile stress S2, wherein S2>S1.

17 Claims, 4 Drawing Sheets

METHOD OF MANUFACTURING SEMICONDUCTOR DEVICE WITH SILICIDE

BACKGROUND

1. Technical Field

The disclosure relates in general to a method of manufacturing a semiconductor device, and more particularly to the method of manufacturing a semiconductor device with less silicide piping defect and reduction of junction leakage.

2. Description of the Related Art

Size of semiconductor device has been decreased for these years.

Reduction of feature size, improvements of the rate, the efficiency, the density and the cost per integrated circuit unit are the important goals in the semiconductor technology. The electrical properties (such as junction leakage) of the device have to be maintained even improved with the decrease of the size, to meet the requirements of the commercial products in applications. In the process of metal silicide of the semiconductor device, the piping defect of silicide is a common issue of junction leakage of device, and it is still lack of effective ways to solve this problem.

SUMMARY

The disclosure is directed to a method of manufacturing a semiconductor device, which the semiconductor device as formed has less or no piping silicide, and the junction leakage of the device is reduced consequently.

According to the disclosure, a method of manufacturing a semiconductor device is provided. First, a substrate, at least with a patterned silicon-containing layer on the substrate and the spacers adjacent to the patterned silicon-containing layer, is provided. A metal layer is formed on the substrate and covers the patterned silicon-containing layer and the spacers. Then, a capping layer is formed on the metal layer. A first rapid thermal process (RTP1) is performed to at least make a portion of the metal layer react with the substrate around the spacers to form the transitional silicides. Then, the capping layer and the unreacted portions of the metal layer are removed. A first nitride film (SIN) with a first tensile stress S1 is formed on the substrate. Then, a second rapid thermal process (RTP2) is performed to transfer the transitional silicide to a silicide and to transfer the first nitride film to a second nitride film with a second tensile stress S2. The second tensile stress of S2 is larger than the first tensile stress of S1.

DETAILED DESCRIPTION

Figure 1A:
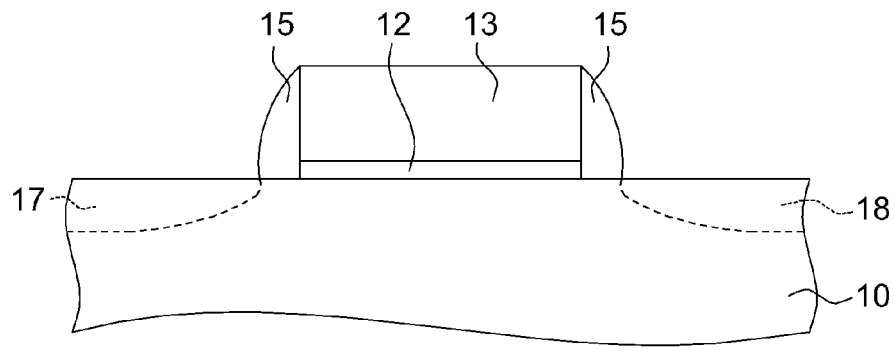
FIG. 1A~FIG. 1F illustrate a method of manufacturing a semiconductor device according to the first embodiment of the present disclosure.

In the present disclosure, a method of manufacturing a semiconductor device is provided to reduce silicide piping defect and improve uniformity of the device. The embodiments are described in details with reference to the accompanying drawings. The identical elements of the embodiments are designated with the same reference numerals. Also, it is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense.

Additionally, "tensile layer" and "compressive layer" of the embodiments are determined based on the stress acting on the specific region of the transistor device, such as source/drain region. For example, a "tensile layer" could be the layer with its own characteristic force, such as retraction, to apply a "tensile stress" on the source/drain region of the transistor device. However, this "tensile layer" may give a "compressive stress" to other non-stress regions. Therefore, the way for applying stress of the tensile layer and the compressive layer should be interpreted in accordance of the descriptions herein. Accordingly, the correspondence between the tensile layer and the compressive layer, or between the tensile stress and the compressive stress, is not opposite absolutely.

First Embodiment

FIG. 1A~FIG. 1F illustrate a method of manufacturing a semiconductor device according to the first embodiment of the present disclosure. First, a substrate 10 at least with a patterned silicon-containing layer 13 on the substrate 10 and the spacers 15 adjacent to the patterned silicon-containing layer 13 is provided. The substrate 10 could be a silicon substrate, and might be applied for the formation of metal-oxide-semiconductor devices. In the first embodiment, a gate oxide layer 12 is formed on the substrate 10, the patterned silicon-containing layer 13 (ex: patterned polysilicon layer) is formed on the gate oxide layer 12, and the spacers 15 are formed at sidewalls of the patterned silicon-containing layer 13 and the gate oxide layer 12, as shown in FIG. 1A. The spacers 15 adjacent to the patterned silicon-containing layer 13 are used to define a predetermined source region 17 and a predetermined drain region 18 at the substrate 10. The gate oxide layer 12 could be a single layer of silicon oxide or silicon nitride, or stacked two layers of silicon oxide and oxide with high dielectric constant. Examples of oxide with high dielectric constant include hafnium oxide and zirconium oxide. Also, a metal nitride could be optionally disposed between the oxide with high dielectric constant and the patterned silicon-containing layer 13 as a buffering layer. The spacers 15 could be a single layer or multi-layer containing different materials.

Figure 1B:
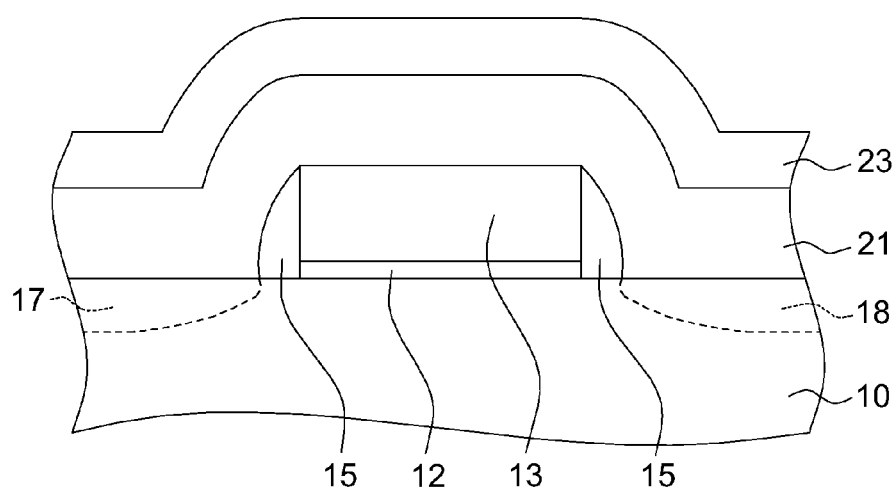
Figure 1C:
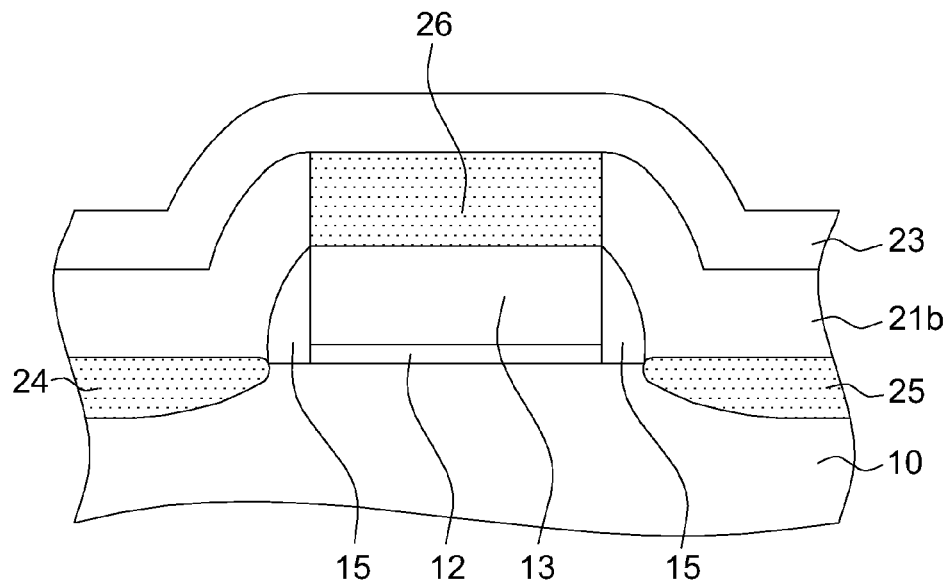

Next, a metal layer 21 is formed on the substrate 10 and covers the patterned silicon-containing layer 13 and the spacers 15, and a capping layer 23 is then formed on the metal layer 21, as shown in FIG. 1B. Examples of the metal layer 21 include Ni, Co, W, and the likes. The capping layer 23 could be a refractory material layer, and material examples of the capping layer 23 include refractory metals, alloys of refractory metals, refractory metal nitride such as TiN, and other materials that prevent the oxidation of the metal layer 21 and don't react with the metal layer 21. In the first embodiment, a nickel layer is deposited as the metal layer 21, and a titanium nitride (TiN) layer is deposited on the nickel layer as the capping layer 23. Examples of materials with high dielectric constant include rare-earth (RE) oxides and lanthanide series metal oxides.

Next, a first rapid thermal process (RTP1) is performed, at least to make a portion of the metal layer 21 react with the substrate 10 around the spacers 15 to form the transitional silicides 24 and 25, as shown in FIG. 10. Furthermore, the metal layer 21 also reacts with the top portion of the patterned silicon-containing layer 13 to form another transitional silicide 26 when the RTP1 is performed in the first embodiment. As shown in FIG. 1A and FIG. 10, the transitional silicides 24 and 25 are formed at the predetermined source region 17 and the predetermined drain region 18, correspondingly. In one embodiment, the first rapid thermal process could be conducted at a first high temperature of T1. The transitional silicides 24, 25 and 26 are unstable and have very high electrical resistance.

Figure 1D:
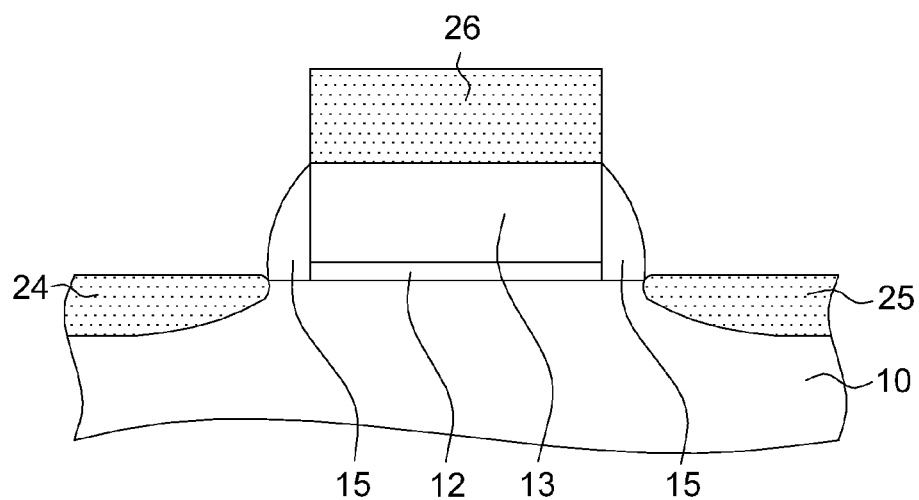

Then, the capping layer 23 and the unreacted portions of the metal layer 21b are removed, as shown in FIG. 1D. The removal step could be conducted by wet etching using suitable chemical agents/solution.

Figure 1E:
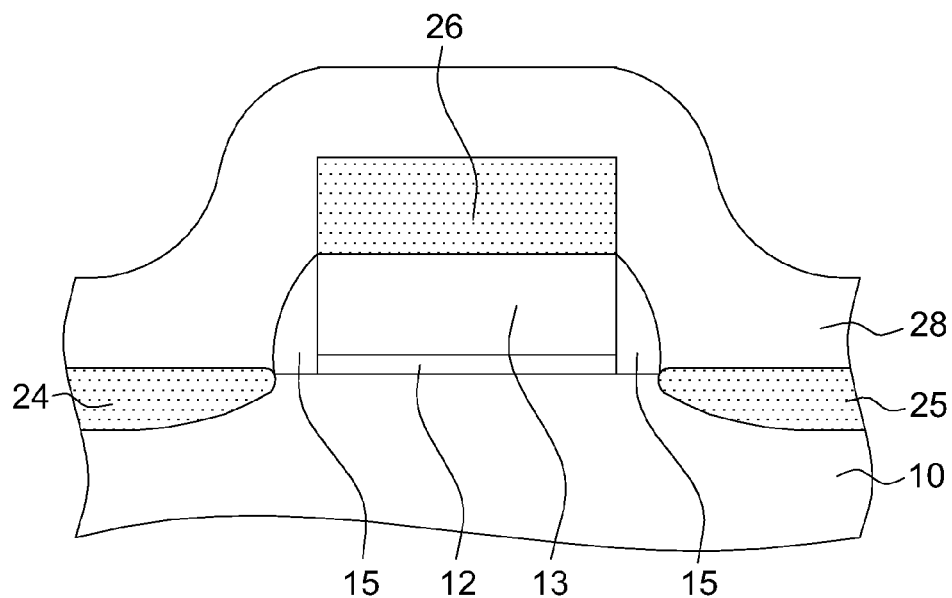
Figure 1F:
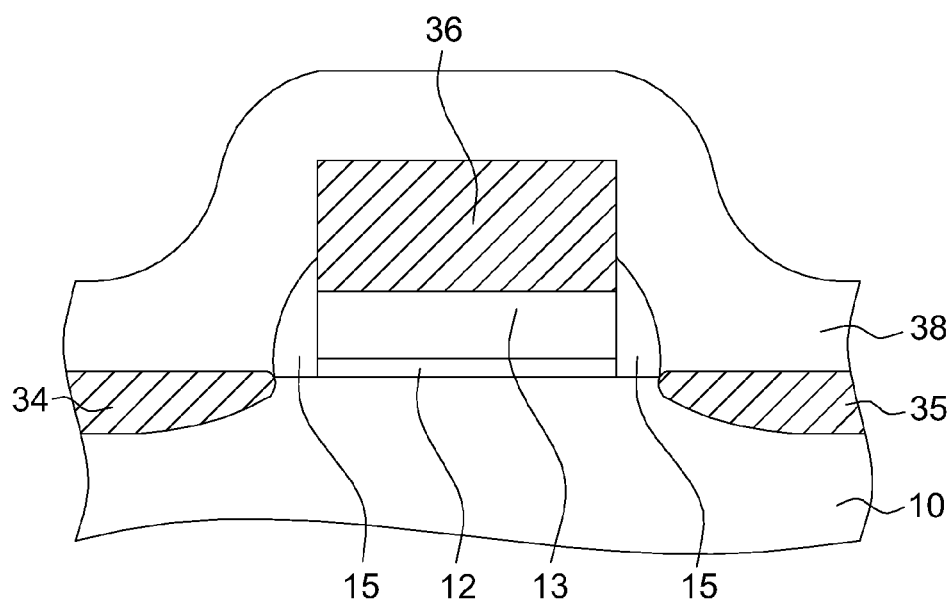

Next, a first nitride film 28 with a first tensile stress S1 is formed on the substrate 10, as shown in FIG. 1E. Accordingly to the first embodiment, the first nitride film 28 is formed to cover the patterned silicon-containing layer 13, the spacers 15, the transitional silicides 24 and 25 at the substrate 10 and the transitional silicide 26 at the patterned silicon-containing layer 26. The first nitride film 28 could be a silicon nitride tensile film. In one embodiment, the first tensile stress S1 could be larger than 500 MPa. After deposition of the first nitride film 28, the process could optionally include step of curing the first nitride film 28. The curing step could be performed by UV radiating for cross-linking the material or de-hydrogen bonding of the first nitride film.

Afterwards, a second rapid thermal process (RTP2) is performed to transfer the transitional silicides 24, 25 and 26 to the silicide 34, 35 and 36, and also transfer the first nitride film 28 to the second nitride film 38 with a second tensile stress S2. The second tensile stress S2 is larger than the first tensile stress S1. Also, the silicide 34, 35 and 36 are much stable and have low electrical resistance than the transitional silicides 24, 25 and 26. In one example, a high tensile silicon nitride film (e.g. the first nitride film 28) with a thickness of 550 Å has a tensile stress of 666 MPa, and the transferred high tensile silicon nitride film (e.g. the second nitride film 38) with a thickness of 550 Å has a tensile stress of 1660 MPa after conducting the RTP2. The tensile stress difference between the first nitride film 28 and the second nitride film 38 is 994 MPa.

The silicide 34, 35 and 36 form a drain (D), a source (S) and a gate electrode, respectively. Before forming the metal layer 21, the epitaxial layers could be formed on the source and the drain, for example, the SiGe epitaxial layer with Si epitaxy grown thereon, the SiC epitaxial layer with silicon epitaxy grown thereon, or the doped silicon epitaxial layer. Accordingly, the silicide could be formed by reacting the metal layer 21 with doped silicon substrate, SiGe epitaxial layer, SiC epitaxy layer, silicon epitaxial layer or a combination thereof. The RTP2 could be performed by using a laser-spiking annealing (LSA), or other methods sufficiently to transfer the transitional silicides to the silicides and transfer the first nitride film 28 to a more tensile nitride film. In one embodiment, the second tensile stress S2 could be larger than 1500 MPa. In one embodiment, the second rapid thermal process could be conducted at a second high temperature T2. The second high temperature T2 is larger than the first high temperature T1.

In the embodiment, the deposition ways of the first nitride film could be adjusted depending on the required thickness of the first nitride film 28 in the practical applications. For example, the first nitride film 28 could be formed by single-layer deposition if the required thickness of the first nitride film 28 is no more than 500 Å. Also, the first nitride film 28 could be formed by multi-layers deposition (ex: depositing layered by layer, and one tensile nitride layer followed by one curing) to prevent unevenness of the first nitride film 28 (ex: protruded edges of the first nitride film) if the required thickness of the first nitride film 28 is larger than 500 Å. Unwanted voids would be occurred during the subsequent ILD deposition if an uneven first nitride film is formed.

Second Embodiment

Figure 2:
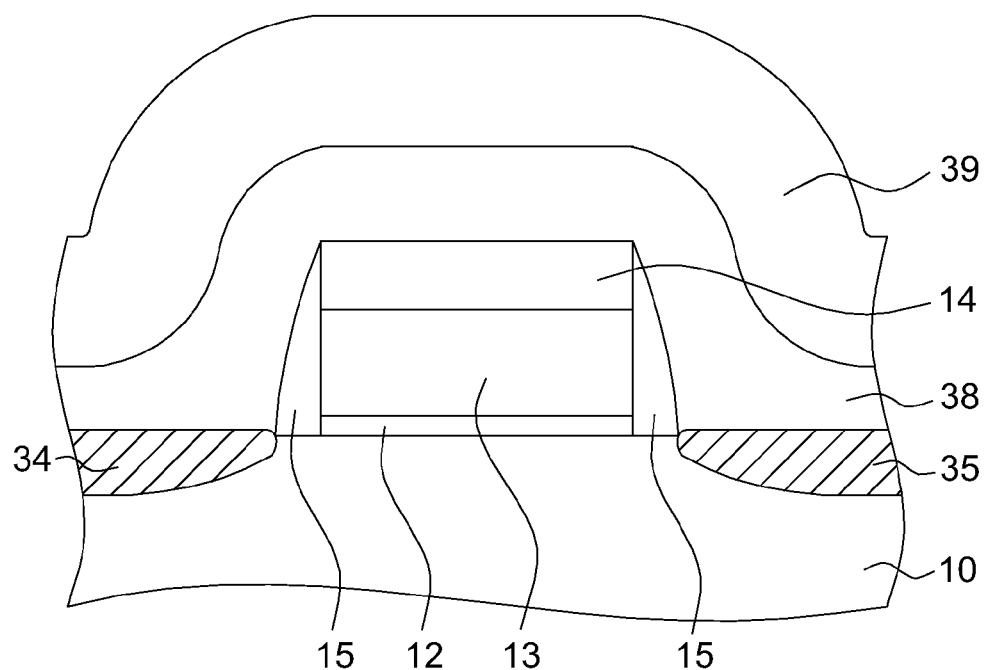
FIG. 2 illustrates a semiconductor device according to the second embodiment of the present disclosure.

FIG. 2 illustrates a semiconductor device according to the second embodiment of the present disclosure. The identical elements of FIG. 1A~FIG. 1F and FIG. 2 are designated with the same reference numerals, and explanation of identical or similar part is not repeated in principle. The main difference between the first and second embodiments is a hardmask 14 formed on the patterned silicon-containing layer 13 in the second embodiment. The method of forming the semiconductor device of the second embodiment could be referred to FIG. 1A~FIG. 1F and slight modification are required.

Please refer to FIG. 2, and also refer to FIG. 1A~FIG. 1F. In the second embodiment, the provided substrate 10 comprises a patterned silicon-containing layer 13, a hardmask 14 (made of dielectric) for example, formed on the patterned silicon-containing layer 13, and spacers 15 adjacent to the hardmask 14 and the patterned silicon-containing layer 13. After forming the metal layer 21 and the capping layer 23 followed by performing the RTP1, the transitional silicides 24 and 25 form respectively at the predetermined source region and the predetermined drain region. After depositing the first nitride film 28 with a first tensile stress of S1 followed by performing the RTP2, the transitional silicides 24 and 25 are transferred to the silicide 34 and 35, and the first nitride film 28 is also transferred to the second nitride film 38 with a second tensile stress of S2 (S2>S1). Similarly, the first nitride film 28 of the second embodiment could be a single layer or a combination of multi-layers, depending on the thickness requirement of practical applications. The hardmask 14 formed on the top of the patterned silicon-containing layer 13 stops the reaction between the metal layer 21 and the patterned silicon-containing layer 13, and there is no silicide formed on the top of the patterned silicon-containing layer 13, as shown in FIG. 2. In the second embodiment, the first nitride film 28 is also formed to cover the hardmask 14, the spacers 15, and the transitional silicides (same positions of silicides 34 and 35) at the substrate 10. In one application, a thick dielectric layer 39 could be further formed on the second nitride film 38, and then the thick dielectric layer 39 and the hardmask 14 could be removed and polished to expose the patterned silicon-containing layer 13.

Other embodiments with different configurations of gate, source and drain are also applicable, which could be varied depending on the actual needs of the applications. It is, of course, noted that the configurations of FIG. 1A-FIG. 1F and FIG. 2 are depicted only for demonstration, not for limitation. It is known by people skilled in the art that the shapes or positional relationship of the constituting elements could be adjusted according to the requirements and/or manufacturing methods of the practical applications.

The capping layer 23 such as TiN film is typically compressive. The more tensile (or less compressive) film capping on the metal layer, the less piping defects of silicides (such as NiSix). The less piping defects of silicides, the smaller the junction leakage. Accordingly to the aforementioned description, the first nitride film 28 of the disclosure with sufficient high tensile property is deposited before the RTP2, thereby reducing the silicide piping risk (ex: NiSix; the reaction between the silicon substrate 10 and the metal (Ni) layer 21) after the RTP2, and decreasing the junction leakage of the device consequently. Therefore, it is no need to change the property of the TiN film from compressive to more tensile, which is difficult and time-consuming. Also, the transferred tensile nitride (i.e. the second nitride film 38) has much higher tensile stress after the RTP2, which enhances the property of the device.

Moreover, according to the aforementioned description, the first nitride film 28 is formed to cover the patterned silicon-containing layer 13 (and/or the hardmask 14), the spacers 15, the transitional silicides 24 and 25 at the substrate 10 (and the transitional silicide 26 at the patterned silicon-containing layer 26) in the embodiments. The entire coverage of the first nitride film 28 cover the components with different materials (including metals and dielectrics) as a blanket would have less patterning loading effect during the RTP2, and the uniformity of device is improved consequently.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of manufacturing a semiconductor device, comprising:
   providing a substrate, at least with a patterned silicon-containing layer on the substrate and spacers adjacent to the patterned silicon-containing layer;
   forming a metal layer on the substrate and covering the patterned silicon-containing layer and said spacers;
   forming a capping layer on the metal layer;
   performing a first rapid thermal process (RTP1) to at least make a portion of the metal layer react with the substrate around the spacers to form a transitional silicide;
   removing the capping layer and unreacted portions of the metal layer;
   forming a first nitride film with a first tensile stress S1 on the substrate; and
   performing a second rapid thermal process (RTP2) to transfer the transitional silicide to a silicide and to transfer the first nitride film to a second nitride film with a second tensile stress S2, wherein the second tensile stress S2 is larger than the first tensile stress S1.

2. The method according to claim 1, further comprising making another portion of the metal layer react with the patterned silicon-containing layer to form another transitional silicide when the RTP1 is performed.

3. The method according to claim 2, further comprising transferring said another transitional silicide to another silicide as a gate electrode when the RTP2 is performed.

4. The method according to claim 2, wherein the first nitride film is formed to cover the patterned silicon-containing layer, said spacers, the transitional silicide at the substrate and said another transitional silicide at the silicon-containing layer.

5. The method according to claim 1, wherein the substrate further comprises a hardmask on the patterned silicon-containing layer, and said spacers are adjacent to the hardmask and the patterned silicon-containing layer.

6. The method according to claim 5, wherein the first nitride film is formed to cover the hardmask, said spacers, and the transitional silicide at the substrate.

7. The method according to claim 1, wherein the spacers are adjacent to the patterned silicon-containing layer to define a predetermined source region and a predetermined drain region, the transitional silicide is formed at the predetermined source region and the predetermined drain region when the RTP1 is performed.

8. The method according to claim 1, wherein the first tensile stress S1 is larger than 500 MPa.

9. The method according to claim 1, wherein the second tensile stress S2 is larger than 1500 MPa.

10. The method according to claim 1, further comprising curing the first nitride film before performing the RTP2.

11. The method according to claim 1, wherein the first nitride film is formed by single-layer deposition.

12. The method according to claim 1, wherein the first nitride film is formed by deposition of multi-layers.

13. The method according to claim 1, wherein the RTP1 is performed at a first high temperature T1, and the RTP2 is performed at a second high temperature T2, and the second high temperature T2 is larger than the first high temperature T1.

14. The method according to claim 1, wherein the RTP2 is performed by using a laser-spiking annealing (LSA).

15. The method according to claim 1, wherein the metal layer comprises Ni, Co, or W.

16. The method according to claim 1, wherein the capping layer comprises refractory material.

17. The method according to claim 1, wherein the first nitride film is a tensile silicon nitride film.

* * * * *